United States Patent
Jeong et al.

(10) Patent No.: US 7,420,852 B2
(45) Date of Patent: Sep. 2, 2008

(54) NON-VOLATILE MEMORY DEVICE PROVIDING CONTROLLED BULK VOLTAGE DURING PROGRAMMING OPERATIONS

(75) Inventors: Jae-Yong Jeong, Yongin-si (KR); Young-Ho Lim, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 152 days.

(21) Appl. No.: 11/265,279

(22) Filed: Nov. 3, 2005

(65) Prior Publication Data
US 2006/0098491 A1    May 11, 2006

(30) Foreign Application Priority Data
Nov. 5, 2004   (KR) .............. 10-2004-0089955

(51) Int. Cl.
*G11C 11/34* (2006.01)
*G11C 16/04* (2006.01)
(52) U.S. Cl. .............. 365/185.27; 365/185.18; 365/185.23
(58) Field of Classification Search ............ 365/185.18, 365/185.23, 185.24, 185.27
See application file for complete search history.

(56) References Cited

U.S. PATENT DOCUMENTS

| | | | |
|---|---|---|---|
| 5,319,601 A * | 6/1994 | Kawata et al. ............ | 365/226 |
| 6,271,714 B1 * | 8/2001 | Shin ........................ | 327/535 |
| 6,611,460 B2 * | 8/2003 | Lee et al. ................ | 365/185.18 |
| 2003/0043673 A1 * | 3/2003 | Hashimoto et al. ........ | 365/222 |

FOREIGN PATENT DOCUMENTS

| | | |
|---|---|---|
| KR | 1020010070041 | 7/2001 |
| KR | 1020020055253 | 7/2002 |
| KR | 1020020095876 | 12/2002 |
| KR | 1020030031652 | 4/2003 |
| KR | 1020020039744 | 5/2005 |

* cited by examiner

*Primary Examiner*—Huan Hoang
*Assistant Examiner*—Kretelia Graham
(74) *Attorney, Agent, or Firm*—Volentine & Whitt, PLLC

(57) ABSTRACT

Disclosed is a non-volatile memory device and a method of programming the same. The non-volatile memory device comprises a plurality of memory cells that are programmed by supplying first and second program voltages thereto. In cases where the second program voltage rises above a predetermined detection voltage, the first program voltage is prevented from being supplied to the memory cell until the second program voltage falls below the detection voltage.

17 Claims, 4 Drawing Sheets

(Vt3 : VBULK detecting level)

NON-VOLATILE MEMORY DEVICE PROVIDING CONTROLLED BULK VOLTAGE DURING PROGRAMMING OPERATIONS

BACKGROUND

1. Field of the Invention

The invention relates generally to a semiconductor memory device. More particularly, the invention relates to a non-volatile memory device and a method of programming the same.

A claim of priority is made to Korean Patent Application No. 2004-89955 filed on Nov. 5, 2004, the disclosure of which is hereby incorporated by reference in its entirety.

2. Description of the Related Art

Semiconductor memories are used in a wide array of electronic applications ranging from personal computers to embedded devices, and from industrial technologies to consumer electronics, as examples. In many cases, the speed and/or capacity of the semiconductor memories pose a performance bottleneck for the devices that use them, and accordingly, there is a constant demand to improve the performance of semiconductor memories by increasing their speed and degree of integration. In order to improve the performance of semiconductor memories, new manufacturing techniques are needed, including processing techniques capable of creating faster, more highly integrated semiconductor memories.

Semiconductor memory devices are generally grouped into two broad categories including volatile semiconductor memory devices and non-volatile semiconductor memory devices. Briefly, volatile semiconductor memory devices provide persistent data storage as long as power is supplied to the devices, but they lose the data once the power is cut off. Non-volatile semiconductor memory devices, on the other hand, provide persistent data storage even when power to the devices is cut off or suspended.

Because of their ability to provide persistent data storage even when power is cut off, non-volatile memory devices are commonly used to provide long term storage for data such as program files and microcode. Non-volatile memory devices are frequently used in application areas such as personal computers, aerospace electronic engineering, communication systems, and consumer electronics.

One special class of non-volatile memory is non-volatile random access memory (nvRAM). A nvRAM may be employed in a system requiring certain benefits of both volatile and non-volatile memories. For example, one type of nvRAM is formed by connecting a static random access memory (SRAM) to a battery so as to prevent the nvRAM from losing its data when system power is cut off. Accordingly, the nvRAM provides fast read/write times while still retaining its data when system power is cut off.

Some non-volatile semiconductor memories are adapted for reprogramming and others are not. For example, due to design limitations, a mask-programmed read-only memory (MROM) or a programmable read-only memory (PROM) can be programmed only once during its lifetime. Erasable programmable read-only memory (EPROM) can be reprogrammed, but only after exposing it to ultraviolet light for several minutes to erase previously stored data. Electrically erasable programmable read-only memory (EEPROM), on the other hand, provides efficient reprogramming capability by allowing memory cells to be reprogrammed by simply applying electric fields to the cells. An EEPROM can generally be reprogrammed more than one hundred thousand times during its lifetime.

Flash memory is a special type of EEPROM in which multiple memory blocks are erased or programmed by a single programming operation. The performance of flash memory is generally superior to that of normal EEPROM, which only allows one memory block to be erased or programmed at a time. In addition, flash memory provides fast access times for read operations and is resistant to physical shock, thus making it an attractive option for high performance portable devices such as cellular phones and personal digital assistants (PDAs).

A typical flash memory comprises an array of transistors called cells, wherein each cell has a source and a drain formed on a substrate and two gate structures formed on the substrate between the source and the drain terminals. The two gate structures generally comprise a floating gate (FG) surrounded by an insulating layer and a control gate (CG) formed on the floating gate. The floating gate is used to store electrons determining a logic state for the cell.

A flash memory cell is read by placing a voltage on its control gate and detecting whether a current flows between its drain and source. Depending on how many electrons are stored in the floating gate, the voltage applied to the control gate will either allow current to flow between the drain and the source or it will not. For example, where a large number of electrons is stored in the floating gate, the electrons have a canceling effect on the voltage applied to the control gate, thereby affecting whether current flows between the drain and the source. In other words, the electrons stored in the floating gate modify the threshold voltage of the cell, i.e. the voltage that has to be applied to the control gate in order for current to flow between the drain and the source.

Although a typical flash memory cell stores only 1-bit of information, a flash memory cell may be designed to store more than one bit by varying the amount of charge accumulated in its floating gate. In a so-called "multi-level" flash memory cell, the logic state of the cell is determined by measuring the amount of current that flows between the drain and the source when a voltage is applied to the control gate.

Due to variations in flash memory cells such as their geometry or a voltage used to program the memory cells, there tends to be variation in the threshold voltages of flash memory cells that have been programmed. Where the variation in the threshold voltages is not properly regulated, it can cause the flash memory to have poor performance.

In order to regulate a threshold voltage distribution for programmed memory cells, the memory cells are generally programmed using an incremental step pulse programming (ISPP) scheme such as that illustrated by FIG. 1. Referring to FIG. 1, a program voltage $V_{WL}$ is applied to a wordline. Program voltage $V_{WL}$ is increased in multiple program loop iterations executed during a programming operation. Each program loop comprises a programming period and a program verification period. In each program loop, programming voltage $V_{WL}$ is incremented by an amount $\Delta V$. During the programming operation, a threshold voltage Vt of a cell being programmed increases by amount $\Delta V$ in each program loop. In order to minimize variation in the threshold voltage distribution, amount $\Delta V$ should be small. As the increment $\Delta V$ becomes smaller, the number of program loops becomes larger. Since there is a tradeoff between the number of program loops required and the variance of the threshold voltage distribution, $\Delta V$ should be chosen to minimize the variance of the threshold voltage as much as possible without significantly limiting the performance of the memory device by requiring too many program loops.

A programming scheme for a non-volatile memory device using ISPP is disclosed, for example, in U.S. Pat. No. 6,266, 270. Circuits for generating programming voltages using ISPP are disclosed, for example, in U.S. Pat. No. 5,642,309 and in Korean Patent Publication No. 2002-39744.

When programming a NOR flash memory device using an ISPP scheme as described above, a wordline voltage of about 10V is applied to a control gate of a flash cell, a bitline voltage of about 5V-6V is applied to the drain of the flash cell and a bulk voltage lower than 0 (e.g., −1V) is applied to a bulk or substrate of the flash cell. In general, a cell current $I_{cell}$ flowing through a memory cell is proportional to $(V_{GS}-Vt)^2$, where Vt is a threshold voltage of the memory cell and $V_{GS}$ is a gate to source voltage of the memory cell. The bitline voltage is generated and maintained by a first charge pump (not shown) and the bulk voltage is generated and maintained by a second charge pump (also not shown). Where the amount of current flowing on the bulk line exceeds the capacity of the second charge pump, the bulk voltage rises above a predetermined voltage level. When the bulk voltage rises above a predetermined voltage level, the threshold voltage of the flash memory cell may fail to increase by a desired amount during a programming loop, as indicated by a broken line in FIG. 1. Accordingly, as more programming loops are executed, the difference between the wordline voltage and the threshold voltage may become larger and larger. As a result, the quality of programming may degrade to a point of program failure.

In order to prevent programming failures from occurring due to an elevated bulk voltage, new techniques are needed for programming flash memory cells.

SUMMARY OF THE INVENTION

In one aspect, the invention relates to a non-volatile memory device and a method of programming the same, wherein programming failures caused by variation in a bulk voltage applied to the non-volatile memory device are prevented from occurring.

In a related aspect, the invention further relates to a non-volatile memory device adapted to temporarily suspend and resume a programming cycle in accordance with variation of the bulk voltage.

One embodiment of the invention provides a method of programming a non-volatile memory device. The method comprises supplying first and second program voltages to a selected memory cell and then suspending the supply of the first program voltage to the selected memory cell in cases where the second program voltage has risen above a predetermined detection voltage. The method further comprises resuming the supply of the first program voltage to the selected memory cell where the second program voltage has fallen below the detection voltage. Typically, the first program voltage comprises a bitline voltage generated by a bitline voltage generating circuit and the second program voltage comprises a bulk voltage generated by a bulk line voltage generating circuit.

Generally, the memory cell comprises a floating gate transistor having a floating gate, a control gate, a bulk, a source, and a drain. The bitline voltage is typically applied to a bitline connected to the drain of the floating gate transistor and the bulk voltage is typically applied to the bulk of the floating gate transistor.

Another embodiment of the invention provides a non-volatile memory device. The non-volatile memory device comprises a memory cell, a program voltage generating circuit, and a program controller. The program voltage generating circuit supplies first and second program voltages to the memory cell during a programming period associated with a programming operation. The program controller controls the program voltage generating circuit, causing it to stop supplying the first program voltage to the memory cell once the second program voltage rises above a predetermined detection voltage during the programming period.

The program controller further controls the program voltage generating circuit to cause it to resume supplying the first program voltage to the memory cell once the second program voltage falls below the detection voltage during the programming period.

The program voltage generating circuit typically comprises a bitline voltage generating circuit generating a bitline voltage as the first program voltage. The program voltage generating circuit typically further comprises a bulk voltage generating circuit generating a bulk voltage as the second program voltage, a write driver supplying a voltage to the memory cell in response to a bitline enable signal generated by the program controller during the programming period, and a detector detecting whether the bulk voltage has risen above the detection voltage. The program controller generally deactivates the bitline enable signal in response to a detection signal output by the detector during the programming period.

According to still another embodiment of the invention, another non-volatile memory device is provided. The non-volatile memory device comprises a memory cell array including memory cells arranged in rows and columns, a column selector adapted to select a subset of the columns, a bitline-voltage generating circuit adapted to generate a bitline voltage during a programming period associated with a programming operation, and a bulk voltage generating circuit adapted to generate a bulk voltage during the programming period. The non-volatile memory device further comprises a write driver driving the selected columns with the bitline voltage in response to a bitline enable signal, a detector sensing whether the bitline voltage has risen above a detection voltage during the programming period, and a program controller generating the bitline enable signal in response to an output of the detector.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
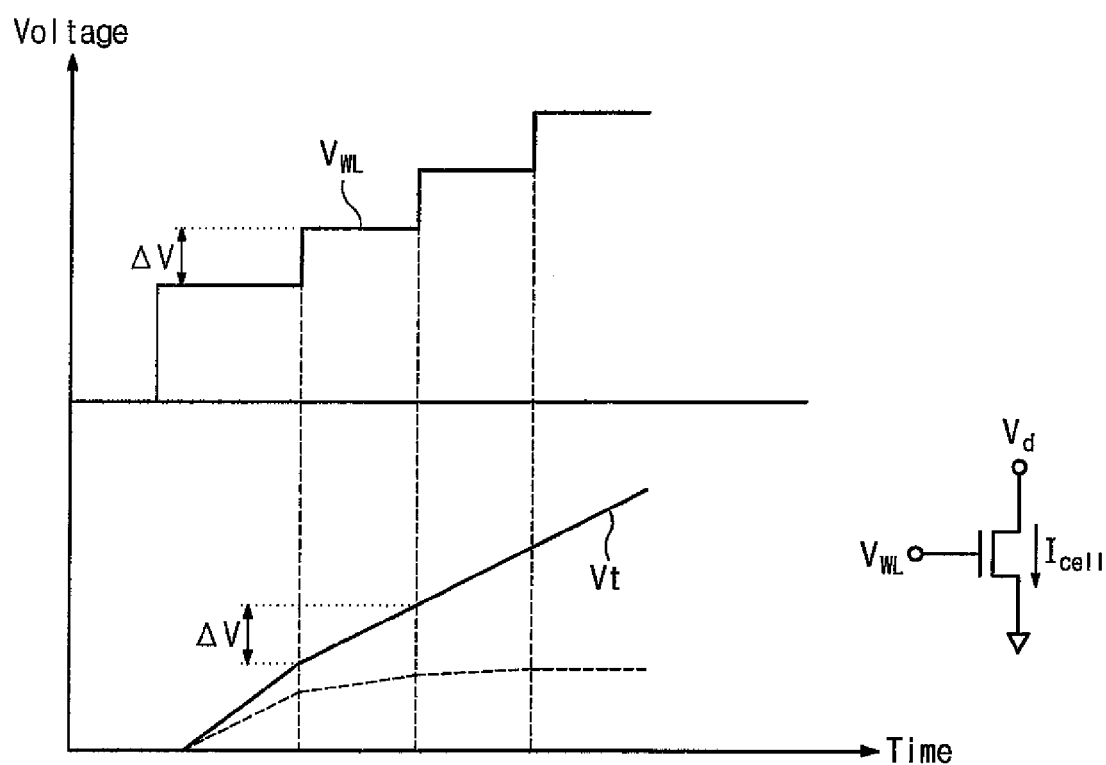
FIG. 1 is a graph showing variation in wordline and threshold voltages during a programming operation of a non-volatile memory device.
Figure 2:
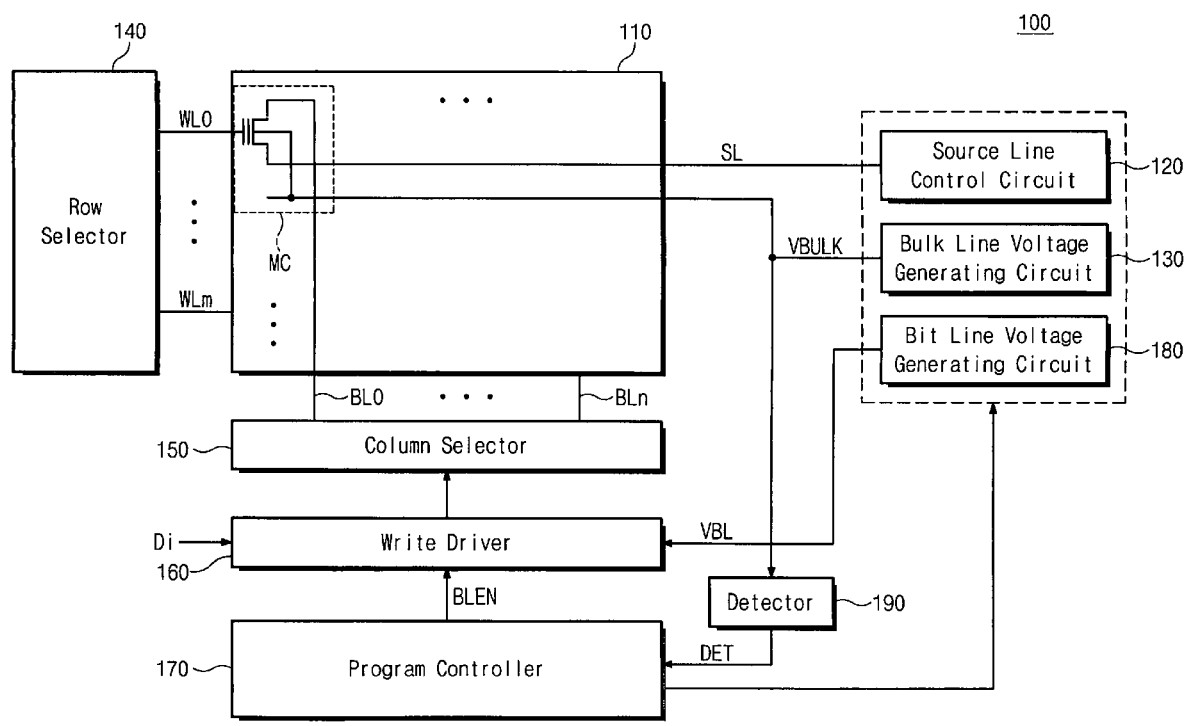
FIG. 2 is a block diagram illustrating a non-volatile memory device in accordance with one embodiment of the invention.

FIG. 2 is a block diagram illustrating a non-volatile memory device in accordance with one embodiment of the invention. The non-volatile memory device shown in FIG. 2 is a NOR flash memory device, however the invention may also be embodied by other types of non-volatile memory, such as masked read-only memory (MROM), programmable read-only memory (PROM), ferroelectric random-access memory (FRAM), NAND flash memory, etc.

Referring to FIG. 2, a non-volatile memory device 100 comprises a memory cell array 110 comprising a plurality of memory cells arranged in a matrix along rows or wordlines WL0 through WLm and columns or bitlines BL0 through BLn.

For purposes of explanation, FIG. 2 shows only a single memory cell MC. Although not shown in the drawings, other memory cells have a similar configuration to memory cell MC.

Memory cell MC is formed of a floating gate transistor having a floating gate, a control gate, a bulk, a source, and a drain. The control gate of the floating gate transistor is connected to a wordline WL0, its drain is connected to a bitline BL0, and its source is connected to a source line SL. In addition, the bulk of the floating gate transistor is connected to a bulk line.

Source line SL is controlled by a source line control circuit 120 (also called a source voltage generating circuit). For example, source line control circuit typically sets source line SL to ground during reading and programming operations, and to a floating state during erase operations.

The bulk of the floating gate transistor is connected to a bulk control circuit 130 (also called a bulk voltage generating circuit) supplying a bulk voltage VBULK to the bulk. Bulk voltage generating circuit 130 typically generates −1V or 0V during a programming operation.

A row selector 140 selects one of wordlines WL0 through WLm in accordance with predetermined row address information and drives the selected wordline with a wordline voltage associated with a current operation mode.

A column selector 150 selects a predetermined unit (e.g., a byte or a word) of bitlines BL0 through BLn in accordance with predetermined column address information.

A write driver 160 drives selected bitline(s) with either a bitline voltage VBL supplied by a bitline voltage generating circuit 180 or a voltage lower than bitline voltage VBL (e.g., ground), depending on a data type associated with input data Di received by write driver 160. For example, input data Di may comprise "program data" or "program inhibit data", where the term "program data" refers to data to be programmed to the memory cells, and the term "program inhibit data" denotes data which is not necessarily to be programmed to the memory cells. In cases where input data Di comprises program data, write driver 160 drives the selected bitline(s) with bitline voltage VBL. In contrast, where input data Di comprises program inhibit data, write driver 160 drives the selected bitline(s) with the voltage lower than bitline voltage VBL.

Write driver 160 operates in response to a bitline enable signal BLEN output by a program controller 170. Program controller 170 activates (i.e., sets to a first logic state) bitline enable signal BLEN during programming periods associated with a programming operation.

Bitline-voltage generating circuit 180 is controlled by program controller 170, to generate bitline voltage VBL. Those skilled in the art will understand that bitline voltage generating circuit 180 can be constructed using a charge pump.

A detector 190 detects whether bulk voltage VBULK rises above a predetermined detection voltage. The detection voltage is designed to be higher than a target voltage for bulk voltage VBULK. Where bulk voltage VBULK rises above the detection voltage, detector 190 activates a detection signal DET. Where bulk voltage VBULK falls below the detection voltage, detector 190 deactivates (i.e., sets to a second logic state) detection signal DET.

During each programming period, program controller 170 controls bitline enable signal BLEN in response to detection signal DET. For example, where detection signal DET is activated, program controller 170 deactivates bitline enable signal BLEN and where detection signal DET is deactivated, program controller 170 activates bitline enable signal BLEN. In other words, during each programming period, whenever bulk voltage VBULK rises above the detection voltage (i.e., whenever detection signal DET is activated), program controller 170 deactivates bitline enable signal BLEN.

Write driver 160 temporarily suspends supplying bitline voltage VBL to selected bitline(s) when bitline enable signal BLEN is deactivated. Because this interrupts current consumption by the selected memory cell(s), bulk voltage VBULK is restored to the target voltage. Once bulk voltage VBULK falls below the detection voltage, detector 190 deactivates detection signal DET. Then, program controller 170 activates bitline enable signal BLEN in response to the inactivation of detection signal DET. Write driver 160 supplies bitline voltage VBL to the selected bitline again in response to the activation of bitline enable signal BLEN.

In the embodiment described above, whenever bulk voltage VBULK becomes higher than the detection voltage, a programming operation is suspended. The programming operation is resumed once bulk voltage VBULK falls below than the detection voltage. In sum, a non-volatile memory device is controlled to suspend or resume a programming operation in response to variation of a bulk voltage during a programming period.

In the embodiments of the invention described above, column selector 150, write driver 160, bitline-voltage generating circuit 180, bulk voltage generating circuit 130, and detector 190 can be viewed as collectively constituting a program voltage generating circuit supplying a program voltage to memory cells in the form of the bitline voltage.

Figure 3:
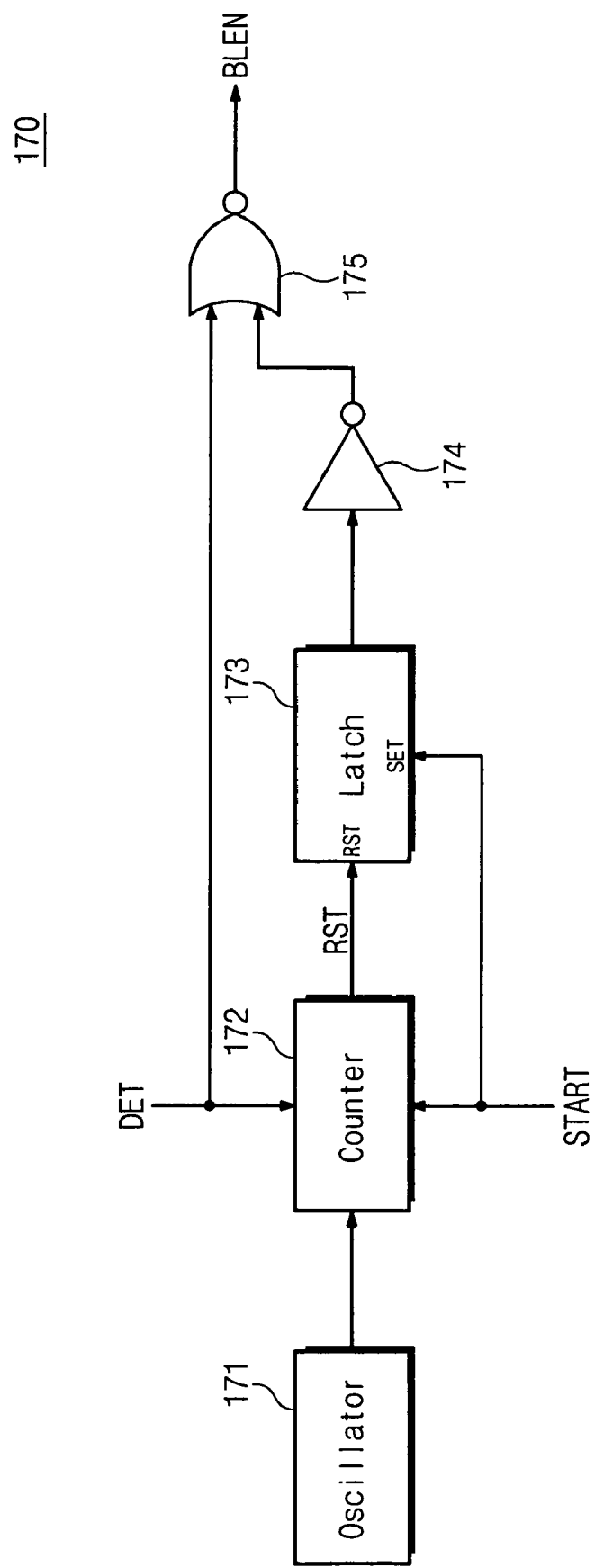
FIG. 3 is a block diagram illustrating an embodiment of a program controller shown in FIG. 2 according to one embodiment of the invention; and, FIG. 4 is a timing diagram illustrating a programming operation of the non-volatile memory device according to an embodiment of the invention.

FIG. 3 is a block diagram illustrating an embodiment of program controller 170 shown in FIG. 2 in accordance with one embodiment of the invention.

Referring to FIG. 3, program controller 170 comprises an oscillator 171, a counter 172, a latch 173, an inverter 174, and a NOR gate 175. Counter 172 is initialized by a program start signal START and conducts a counting operation in response to an output of oscillator 171. Program start signal START is typically activated at the beginning of each programming period. Once a count of counter 172 reaches a predetermined reset value, counter 172 outputs a reset pulse signal RST.

Counter 172 is suspended whenever detection signal DET is activated. In other words, counter 172 suspends counting whenever detection signal DET is activated and resumes counting whenever detection signal DET is deactivated.

An output of latch 173 is activated in response to program start signal START and deactivated in response to reset pulse signal RST. NOR gate 175 receives the output of latch 173 after it has been inverted by inverter 174 and detection signal DET and outputs bitline enable signal BLEN. Accordingly, the logic state of bitline enable signal is determined by reset pulse signal RST, program start signal START, and detection signal DET.

Figure 4:
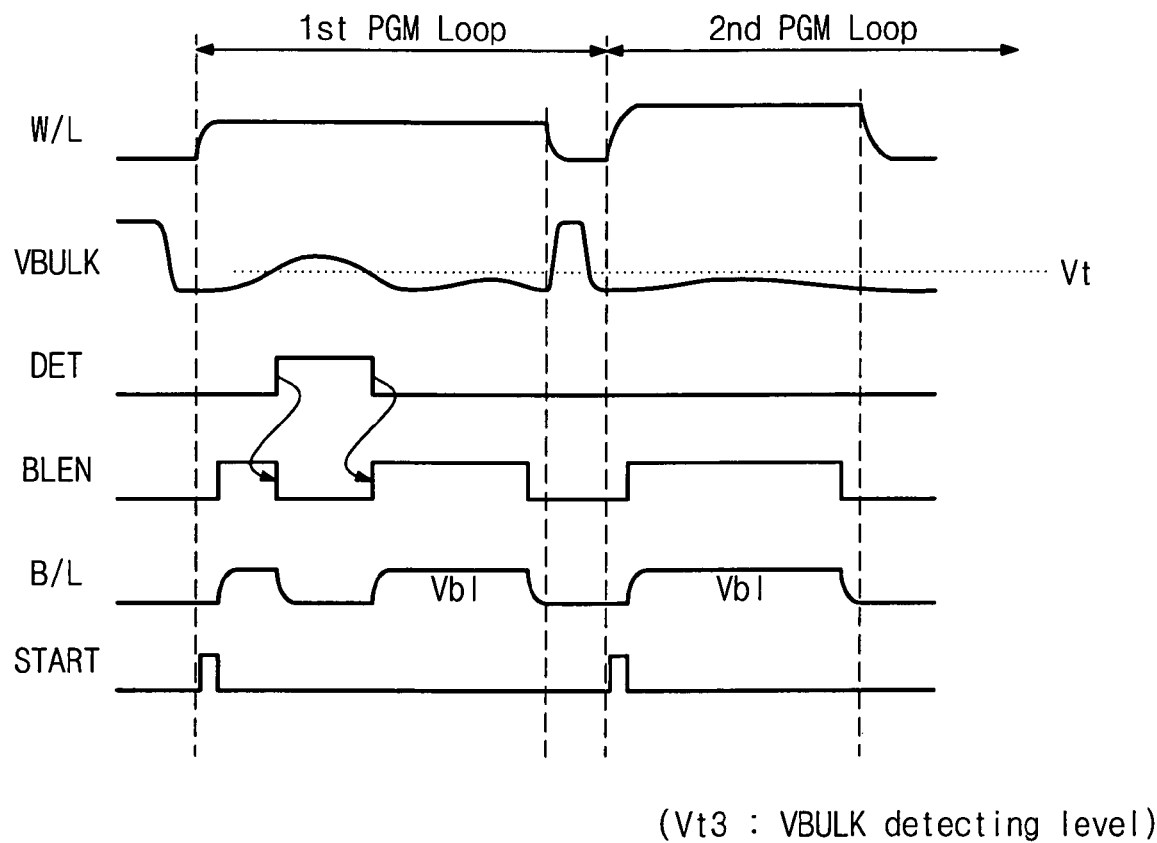

FIG. 4 is a timing diagram illustrating a programming operation of the non-volatile memory device in accordance with one embodiment of the invention. The programming operation comprises a plurality of programming loops and each programming loop comprises a programming period and a program verification period. In a non-volatile memory device using an ISPP scheme, the wordline voltage driving the selected wordline is incrementally increased with each successive programming loop iteration. In contrast, in a non-volatile memory device not using an ISPP scheme, a wordline voltage is maintained at a constant level even where multiple programming loops are executed.

Referring to FIG. 4, a programming operation is typically initiated by inputting a program command to the non-volatile memory device. Once the program command is input to the device, voltage generators associated with the memory device provide the wordline voltage, the bitline voltage, and the bulk voltage. Next, at the beginning of a first programming loop, program start signal START is activated and row selector 140 drives a selected wordline with a wordline voltage $V_{WL}$, as shown in FIG. 4. In addition, bulk voltage VBULK is applied to the bulk of the memory cell by bulk voltage generating circuit 130.

Then, in response to the activation of program start signal START, program controller 170 activates bitline enable signal BLEN. In addition, counter 172 is also initialized in response to activation of the program start signal START and begins counting in response to an output signal (e.g., an oscillation signal) from oscillator 171. Once bitline enable signal BLEN is activated, write driver 160 drives selected bitline(s) with bitline voltage VBL. Under these conditions, selected memory cell(s) begin to be programmed.

In a programming operation, bulk voltage VBULK may rise above a detection voltage Vt due to a cell current flowing through memory cell(s) being programmed. An example where bulk voltage VBULK rises above detection voltage Vt is illustrated by a dotted line in FIG. 4. Where bulk voltage VBULK rises above detection voltage Vt, detector 190 activates detection signal DET. Once detection signal DET is activated, the operation of counter 172 is suspended. Counter 172 therefore maintains its current value.

Bitline enable signal BLEN output from NOR gate 175 is deactivated in response to an activation of detection signal DET. In response to the inactivation of bitline enable signal BLEN, write driver 160 suspends the supply of bitline voltage VBL to selected bitline(s). In other words, the programming operation illustrated in FIG. 4 is temporarily suspended during the first programming period.

While the supply of bitline voltage VBL is interrupted, bulk voltage generating circuit 130 restores bulk voltage VBULK to the target voltage. While bulk voltage VBULK is being restored to the target voltage, detector 190 checks whether bulk voltage VBULK is lower than detection voltage Vt. Where bulk voltage VBULK falls below detection voltage Vt, detector 190 deactivates detection signal DET. In response to the inactivation of detection signal DET, the output of NOR gate 175, i.e., bitline enable signal BLEN is activated. In response to the activation of bitline enable signal BLEN, write driver 160 drives selected bitline(s) with bitline voltage VBL, thereby causing the suspended programming operation to resume.

In response to the inactivation of detection signal DET, counter 172 resumes counting. Once the count of counter 172 reaches the predetermined reset value, counter 172 generates reset pulse signal RST. The output of latch 173 is deactivated by the generation of reset pulse signal RST. Bitline enable signal BLEN is then deactivated in response to the inactivation of the output of latch 173. Finally, the voltage applied to the selected wordline is discharged, thereby completing the first programming loop of the programming operation. Thereafter, the program verification operation of the first programming loop begins.

As stated above, an increase in bulk voltage VBULK during a programming period may lead to programming failures. In order to prevent such programming failures from occurring due to the increase of the bulk voltage VBULK, the programming operation is suspended when the bulk voltage VBULK rises above detection voltage Vt. Where bulk voltage VBULK again falls below detection voltage Vt, the suspended programming operation is resumed. Such mechanisms for suspending and resuming the programming operation allow the threshold voltage of the memory cell to be increased by a desired amount during every programming period. Thus, programming failures are avoided, thereby improving the programming characteristics of the device.

As previously mentioned, the invention prevents programming failures from occurring due to an increase in the bulk voltage, by suspending and resuming a programming operation in accordance with variation of the bulk voltage.

The foregoing preferred embodiments are teaching examples. Those of ordinary skill in the art will understand that various changes in form and details may be made to the exemplary embodiments without departing from the scope of the present invention which is defined by the following claims.

What is claimed:

1. A method of programming a non-volatile memory device including a selected memory cell comprising a bulk, and adapted to store data in relation to program voltage respectively applied to the bulk, and a bit line and a word line associated with the selected memory cell, the method comprising:

supplying a bitline voltage to the bit line and a bulk voltage to the bulk of the selected memory cell;

suspending the supply of the bitline voltage to the selected memory cell upon determining that the bulk voltage rises above a detection voltage; and resuming the supply of the bitline voltage to the selected memory cell upon determining that the bulk falls below the detection voltage.

2. The method of claim 1, wherein the selected memory cell further comprises a floating gate transistor comprising; the bulk, a floating gate, a control gate, a source, and a drain.

3. The method of claim 2, wherein the control gate is connected to the wordline, the drain is connected to the bitline, and the source is connected to a source line.

4. The method of claim 1, wherein the bulk voltage is generated by a bulk voltage generating circuit.

5. The method of claim 4, wherein the bulk voltage is applied to the bulk of the selected memory cell from the bulk voltage generating circuit through a bulk line.

6. A non-volatile memory device, comprising:

a memory cell;

a program voltage generating circuit adapted to supply first and second program voltages to the memory cell during a programming period;

a program controller adapted to control the program voltage generating circuit, wherein the program voltage generating circuit suspends the supply of the first program voltage to the memory cell following a determination that the second program voltage has risen above a detection voltage during the programming period, and resumes the supply of the first program voltage to the memory cell following a determination that the second program voltage has fallen below the detection voltage during the programming period, wherein the first program voltage is a bitline voltage applied to a bitline of the memory cell and the second program voltage is a bulk voltage applied to a bulk of the memory cell.

7. The non-volatile memory device of claim 6, wherein the program voltage generating circuit comprises:
a bitline voltage generating circuit adapted to provide the bitline;
a bulk voltage generating circuit adapted to provide the bulk voltage;
a write driver adapted to supply a voltage to the memory cell in response to a bitline enable signal generated by the program controller during the programming period; and,
a detector detecting whether the bulk voltage has risen above the detection voltage;
wherein the program controller deactivates the bitline enable signal in response to a detection signal output by the detector during the programming period.

8. The non-volatile memory device of claim 7, wherein the program controller deactivates the bitline enable signal following a determination that the bulk voltage has risen above the detection voltage during the programming period, thereby suspending the supply of the bitline voltage to the memory cell.

9. The non-volatile memory device of claim 8, wherein the program controller activates the bitline enable signal following a determination that the bulk voltage has fallen below the detection voltage during the programming period, thereby resuming the supply of the bitline voltage to the memory cell.

10. The non-volatile memory device of claim 7, wherein the detector receives the bulk voltage output by the bulk voltage generating circuit.

11. The non-volatile memory device of claim 6, wherein the memory cell comprises a floating gate transistor comprising a floating gate, a control gate, the bulk, a source, and a drain.

12. The non-volatile memory device of claim 11, wherein the control gate is connected to a wordline, the drain is connected to a bitline, and the source is connected to a source line.

13. A non-volatile memory device, comprising:
a memory cell array comprising memory cells arranged in rows and columns;
a column selector adapted to select a subset of the columns;
a bitline voltage generating circuit adapted to generate a bitline voltage during a programming period associated with a programming operation;
a bulk voltage generating circuit adapted to generate a bulk voltage during the programming period;
a write driver driving the selected columns with the bitline voltage in response to a bitline enable signal;
a detector detecting whether the bulk voltage has risen above a detection voltage during the programming period; and,
a program controller generating the bitline enable signal at the beginning of the programming period in response to an output of the detector, and deactivating the bitline enable signal following a determination that the bulk voltage has risen above the detection voltage during the programming period, thereby suspending a supply of the bitline voltage to the memory cells.

14. The non-volatile memory device of claim 13, wherein the program controller activates the bitline enable signal following a determination that the bulk voltage has fallen below the detection voltage during the programming period, thereby resuming the supply of the bitline voltage to the memory cells.

15. The non-volatile memory device of claim 13, wherein the detector is adapted to detect the bulk voltage output from the bulk voltage generating circuit.

16. The non-volatile memory device of claim 13, wherein each of the memory cells comprises a floating gate transistor comprising a floating gate, a control gate, a bulk, a source, and a drain.

17. The non-volatile memory device of claim 16, wherein the control gate is connected to a wordline, the drain connected to a bitline, and the source is connected to a source line.

* * * * *